(12) United States Patent
Gattuso et al.

(10) Patent No.: US 7,566,237 B2
(45) Date of Patent: Jul. 28, 2009

(54) ACTUATOR MEMBER FOR SOCKET CONNECTOR

(75) Inventors: Andrew Gattuso, Chandler, AZ (US); Chun-Fu Lin, Tu-cheng (TW); Ke-Hao Chen, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/811,827

(22) Filed: Jun. 11, 2007

(65) Prior Publication Data

US 2008/0305670 A1     Dec. 11, 2008

(51) Int. Cl.
*H01R 13/62* (2006.01)
(52) U.S. Cl. ............................................. 439/331
(58) Field of Classification Search ............... 439/73, 439/330, 331, 342
See application file for complete search history.

(56) References Cited

U.S. PATENT DOCUMENTS 6,353,329 B1 *  3/2002  Kiffe .......................... 324/760
6,881,088 B2 *  4/2005  Gattuso et al. ............. 439/342

* cited by examiner

*Primary Examiner*—Ross N Gushi
(74) *Attorney, Agent, or Firm*—Wei Te Chung

(57) ABSTRACT

A socket connector assembly for holding a semiconductor package comprises a socket connector and an actuator assembled to the socket connector. The actuator comprises a housing defining an opening on a bottom face thereof; a cam portion retained to the housing and being able to rotate; and a floating module. The floating module is movably mounted to the housing and defines a topmost position and a lowermost position relative to the housing. The floating moves between the topmost position and the lowermost position during a rotation of the cam portion. The floating module has an engaging portion to contact with the semiconductor package when the floating module is at the lowermost position.

18 Claims, 10 Drawing Sheets

ACTUATOR MEMBER FOR SOCKET CONNECTOR

BACKGROUND OF THE INVENTION

1. Field of the Invention

The present invention relates to the art of electrical connector, and more specially to an actuator incorporated in a socket connector for electrically interconnecting two electrical interfaces, such as a semiconductor package and a circuit board.

2. Description of the Prior Art

U.S. Pat. No. 7,161,805 discloses an electrical connector comprising a socket and an actuator detachably mounted on the socket. The socket has a base receiving a plurality of terminals, a movable cover mounted on the base, a rectangular lid movably attached to the base via transmitting members, and springs disposed between the lid and the base. The actuator has a frame, a U-shaped handle rotatablely assembled to two opposed sides of the frame, a pair of latching members for retaining the actuator to the socket, a heat sink and a retainer for retaining the heat sink in the frame. The handle is formed with a pair of cam portions adjacent to two opposed outside surfaces the frame. When rotating the handle relative to the frame, the cam portions will rotate together with the handle and downwardly press the lid and drive the transmitting members to bring the cover moving between an open position and a close position relative to the base. A semiconductor package received in the base will electrically contact with the terminals in the base at the close position. However, the socket of the electrical connector has a complex configuration, and the actuator need additional retainer to retain the heat sink.

Accordingly, a new electrical connector that solves the above problems is desirable.

SUMMARY OF THE INVENTION

Accordingly, an object of the present invention is to provide an actuator for a socket which has cam portions.

To fulfill the above object, an actuator comprises a housing defining an opening on a bottom face thereof; a cam portion retained to the housing and being able to rotate; and a floating module movably mounted to the housing and defining a topmost position and a lowermost position relative to the housing, the floating module being able to move between the topmost position and the lowermost position during a rotation of the cam portion.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Figure 1:
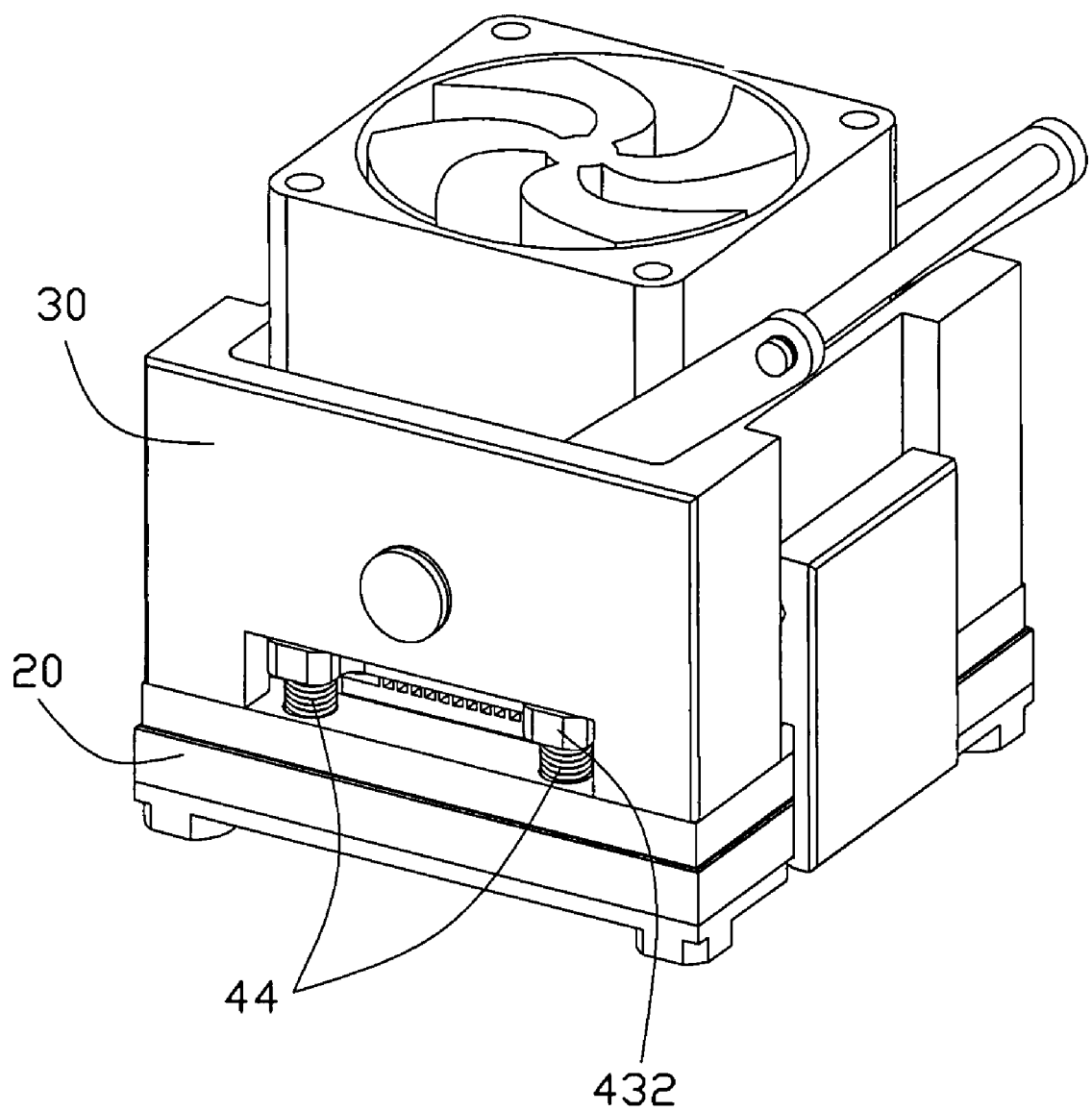
FIG. 1 is an assembly, perspective view of a socket connector assembly according to the present invention, with a fan and a semiconductor package received in the socket connector assembly, wherein an actuator of the socket connector assembly is in an opening position.

Reference is now made to the drawings to describe the invention in detail.

Referring to FIGS. 1-4, the socket connector assembly 10 is mainly applied for testing a semiconductor package 100, through a test board (not shown). The socket connector assembly 10 comprises a socket connector 20 and an actuator 30 detachably mounted on the socket connector 20.

The socket connector 20 receives a plurality of terminals (not shown) for contacting with the semiconductor package 100. The socket connector 20 has a mounting surface (not labeled) mounted on the test PCB and defines a receiving space 21 in a center thereof for receiving the semiconductor package 100. The socket connector 20 further defines a pair of engaging recesses 22 recessed upwardly from a bottom face of opposed lateral sides thereof for engaging with the actuator 30.

Figure 5:
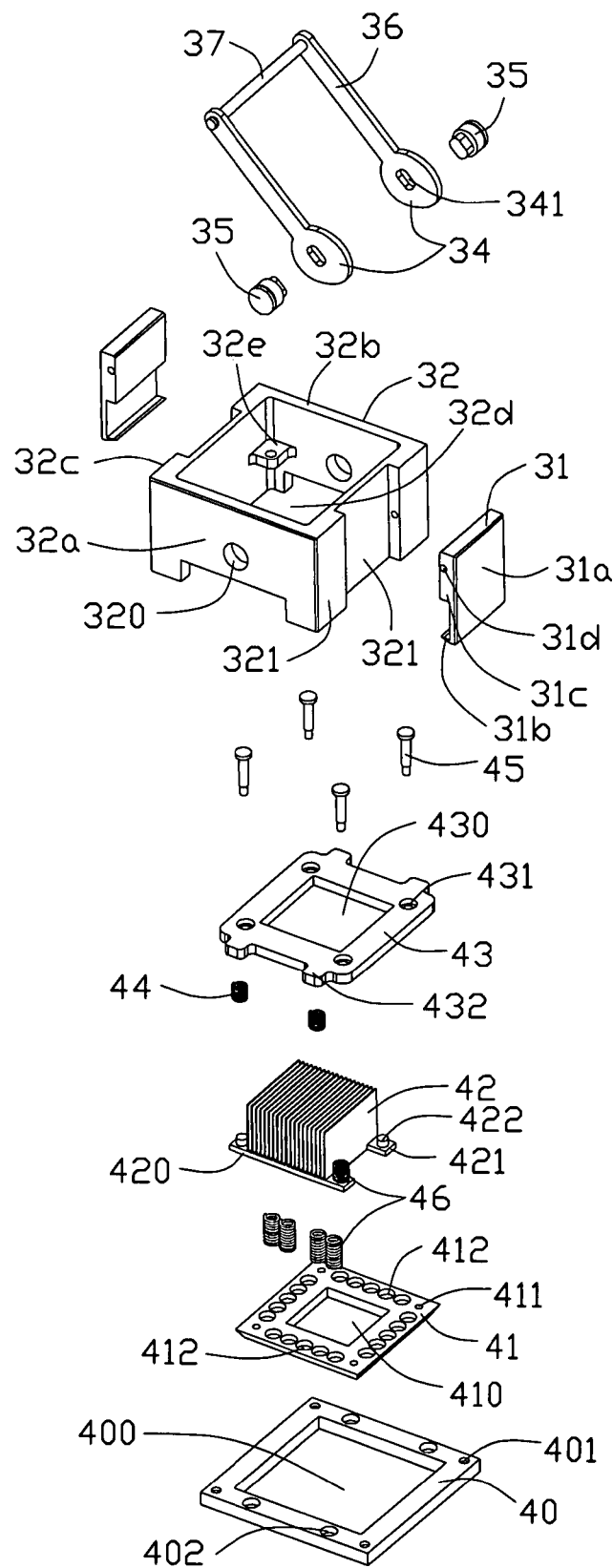
FIG. 5 is a partially exploded, perspective view of the actuator.
Figure 6:
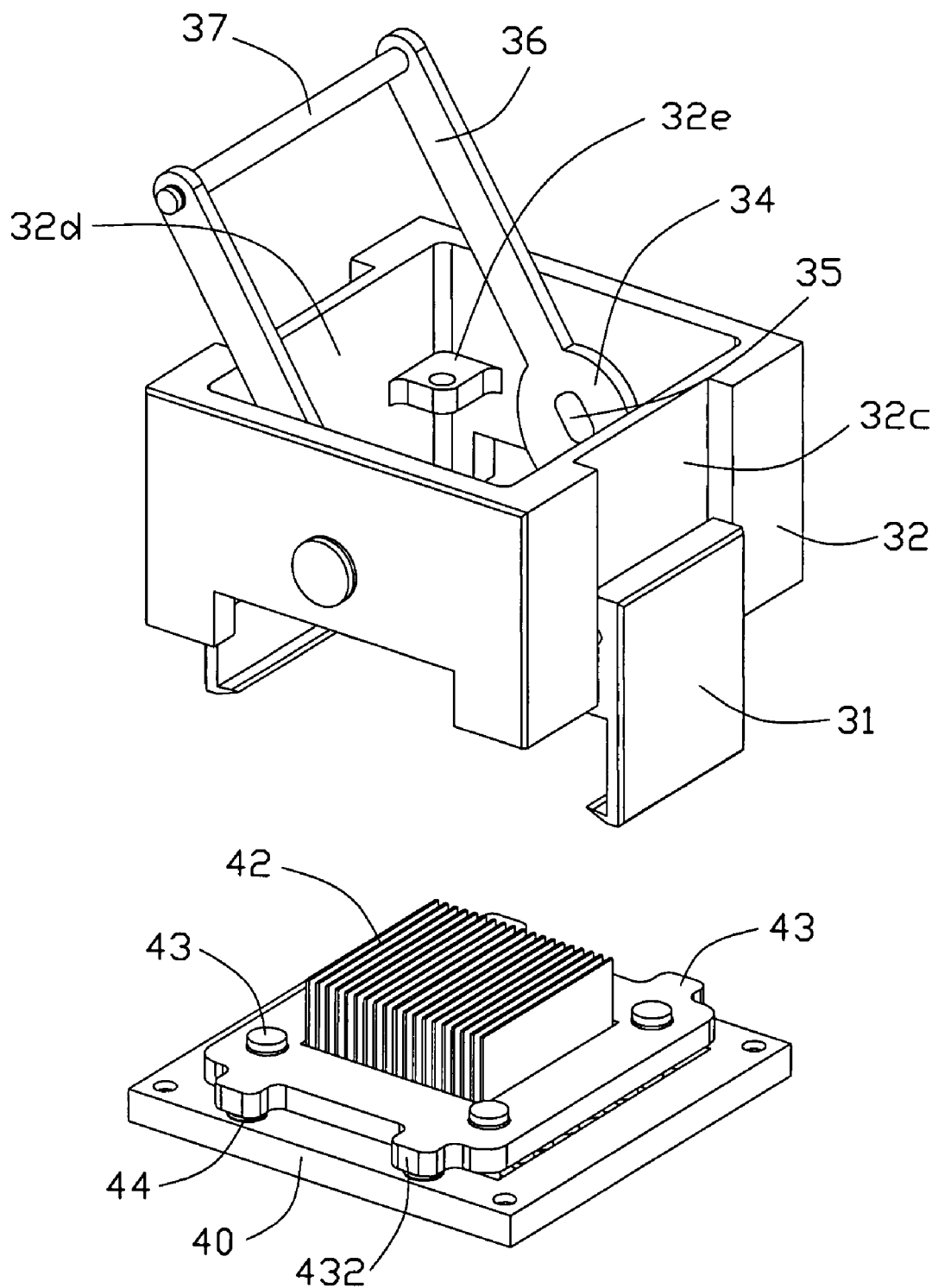
FIG. 6 is an exploded, perspective view of the actuator.
Figure 7:
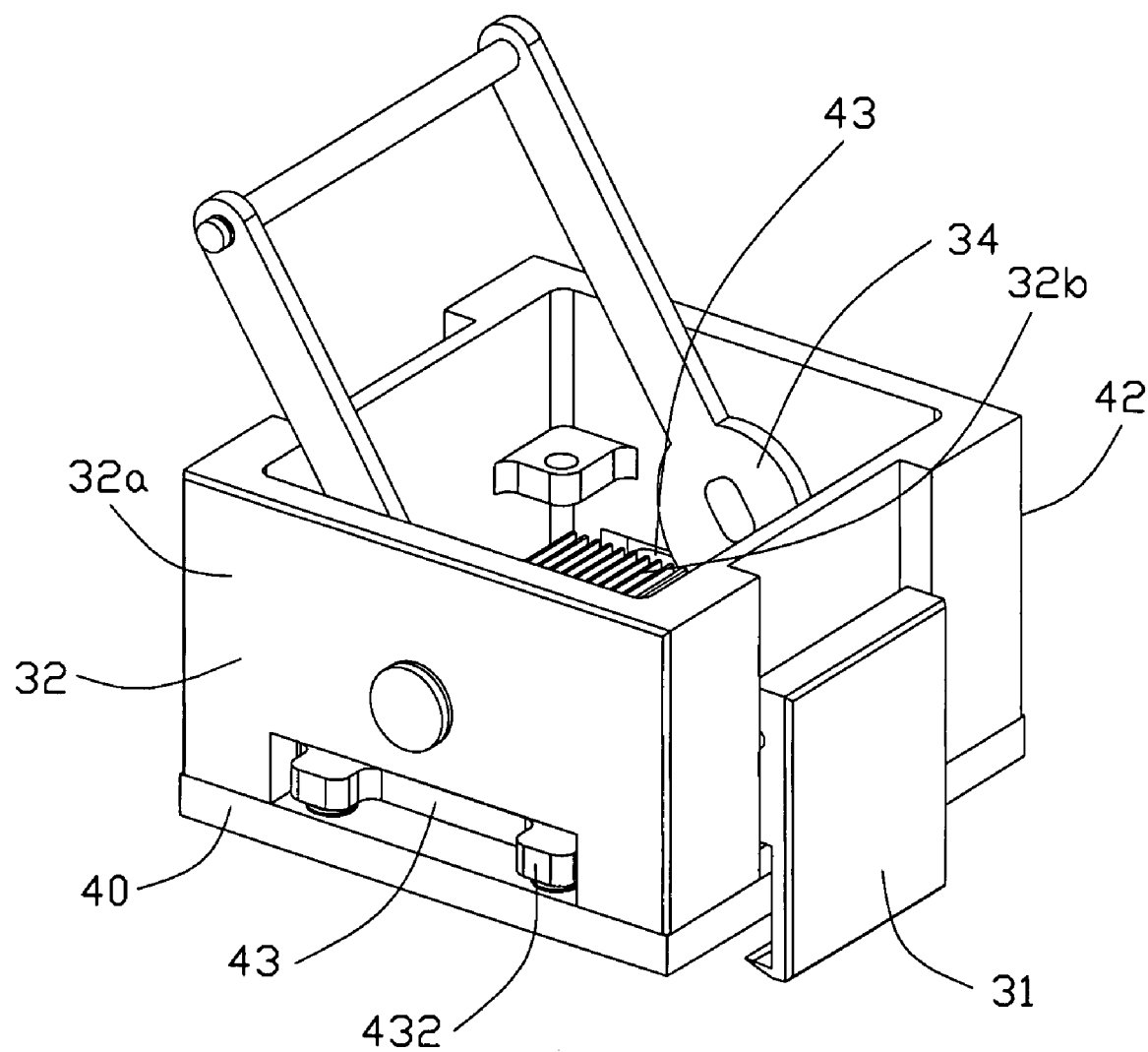
FIG. 7 is an assembly, perspective view of the actuator shown in FIG. 4.
Figure 8:
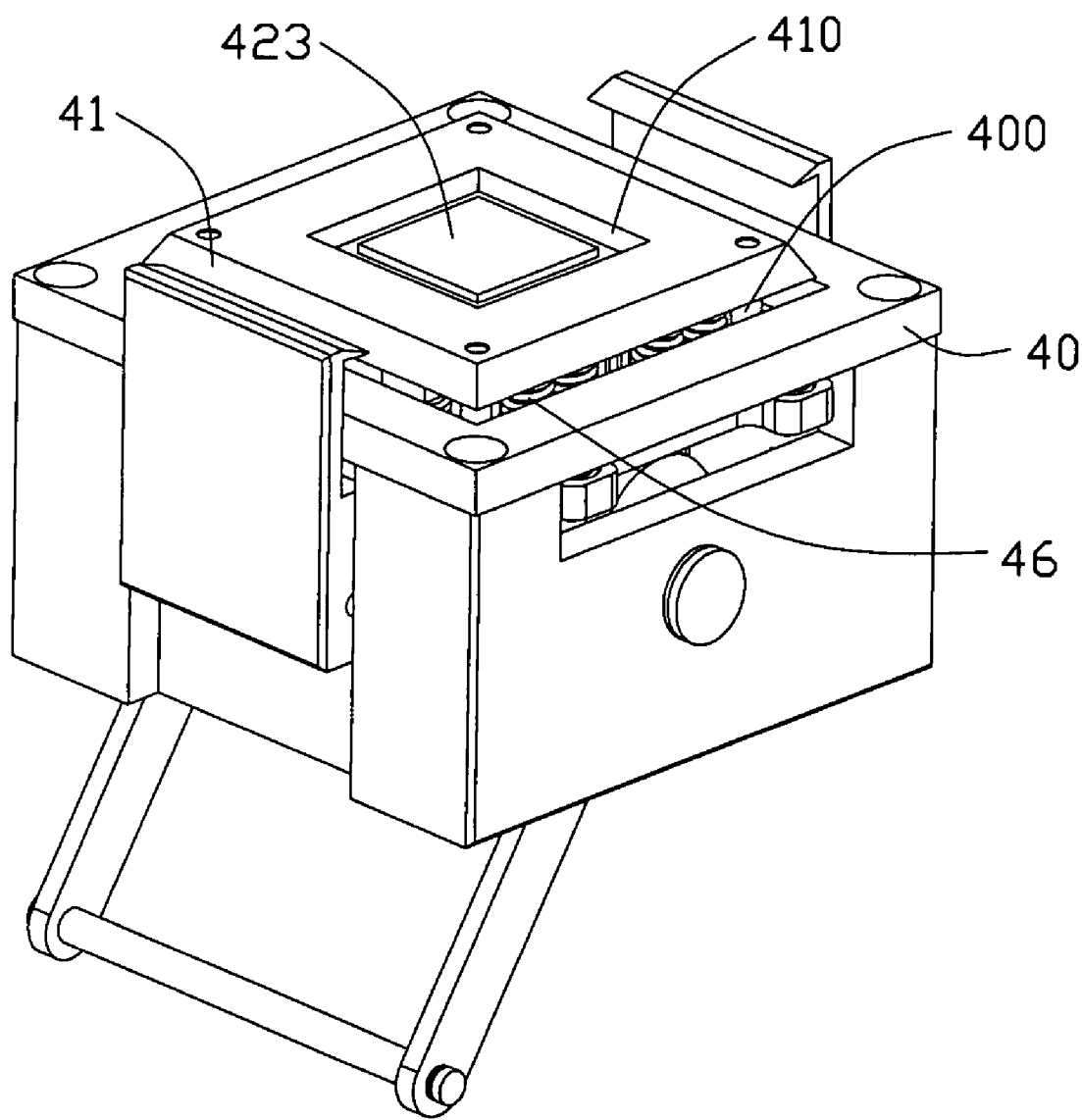
FIG. 8 is another assembly, perspective view of the actuator taken from a bottom side.

Referring to FIGS. 5 and 6, conjoined with FIG. 7 and 8, the actuator 30 is formed from metal material or high density material. The actuator 30 has a rectangular frame 32 comprising a front wall 32a, a back wall 32b, two side walls 32c spanning between the front wall 32a and the back wall 32b. The walls cooperatively define a rectangular through opening 32d. The frame 32 has four supporting boards 32e for supporting a fan (not labeled).

A pair of cam members 34 are respectively rotatably attached to the front wall 32a and the back wall 32b, preferably to middles of the front wall 32a and the back wall 32b. Each cam member 34 defines an approximately ellipse hole 341. Each of the front wall 32a and the back wall 32b defines a positioning hole 320. The cam members 34 are assembled to inner sides of the front wall 32a and the back wall 32b by a pair of blots 35 inserting into the ellipse holes 341 through the positioning holes 320 of the front wall 32a and the back wall 32b from out sides of the frame 32. A pair of actuating levers 36 are respectively integratedly connected to edges of the cam members 34, for facilitate driving the cam members 34. A cross handle 37 is disposed between two free ends of the pair of actuating levers 36 for being conveniently held by a user during driving.

Each side wall 32c defines an engaging slot 321. A pair of bores (not labeled) are defined in opposite sides of each engaging slot 321. A pair of latching arms 31 are respectively attached to the frame 32 for holding the actuator 30 on the socket connector 20. Each latching arm 31 comprises a body 31a, a hook-like leg 31b at a distal end of the body 31a for holding on a corresponding engaging recess 22 of the socket connector 20. A top end 31c of the body 31a defines an enlarged configuration for being conveniently pressed and has pair of pins 31d extending outwardly from opposite sides thereof. The latching arm 31 is pivotally attached to the side walls 32c of the frame 32 by the pins 31d inserting into the bores (not labeled) of the frame 32.

Continuing referring to FIGS. 5-8, A base 40 defines a rectangle opening 400 in a center thereof, four retaining holes 401 on four corners thereof and four receiving holes 402 divided into two group on two front and back sides thereof. A floating module mounts to the base 40 with a plurality of first springs therebetween.

The floating module comprises a rectangle casing 41, a heat sink 42, a cover 43 and a plurality of second springs 46. The casing 41 defines a hatch 410, four retaining holes 411 on four corners and a plurality of receiving holes 412 between each two retaining holes 411. The heat sink 42 has a bottom board 420 which is formed with four mounting ears 421 outside four corners of the heat sink 42 and a plurality of fin-like dissipating-heat plates (not labeled) on the bottom board 420. Each mounting ear 421 has a protruding 422. The cover 43 defines a mouth 430 in a center thereof and four through holes 431 near four corners thereof. The cover 43 defines a mouth 430 in a center thereof and four through holes 431 on four corners thereof, and has four projecting portions 432 extending outwardly from opposed ends of front and back edges thereof.

The heat sink 42 is assembled to the casing 41 by mounting ears 421 being supported by the casing 41, then, the second springs 46 are respectively disposed on the receiving holes 412 of the casing 41 and the mounting ears 421 of the heater sink 42. After that, the cover 43 is put upon the second springs 46 by a top portion of the heater sink 42 passing through the mouth 430 of the cover 43, at last, the bolts 45 pass through the through holes 431 of the cover 43 and the retaining holes 411 of the casing 41 to retain the cover 43 to the casing 41, the heat sink 42 is sandwiched by the cover 43 and the casing 41. The heat sink 42 further has an engaging portion 423 (referring to FIG. 8) downwardly protruding from the bottom board 420 thereof and further protruding out a bottom face of the casing 41 through the hatch 410 of the casing 41. By now, the floating module is completely assembled.

Continuing referring to FIGS. 6-8, the assembled floating module is set on the base 40 with the first springs 46 disposed between the projecting portions 432 of the cover 43 and the receiving holes 402 of the base 40, so the floating module is able to move upwardly and downwardly relative to the base 40. Then, the frame 32 mounts on the base 40, during this process, the latching arm 31 may appreciably rotates outwardly to let the base 40 close to a bottom face of the frame 32. The size of the base 40 is approximately equal with that of the frame 32, the retaining holes 401 engages with pins (not shown) on the bottom face of the frame 32 to position the base 40 to the frame 32, the projecting portions 432 of the cover 43 are located in gaps (not labeled) defined on a bottom edge of the front wall 32a and the back wall 32b of the frame 32, and can move in a top-to-bottom direction. Referring to FIG. 8, the engaging portion 423 of the floating module extends beyond a bottom face of the base 40 to press the semiconductor package 100 in the socket connector 20.

Figure 2:
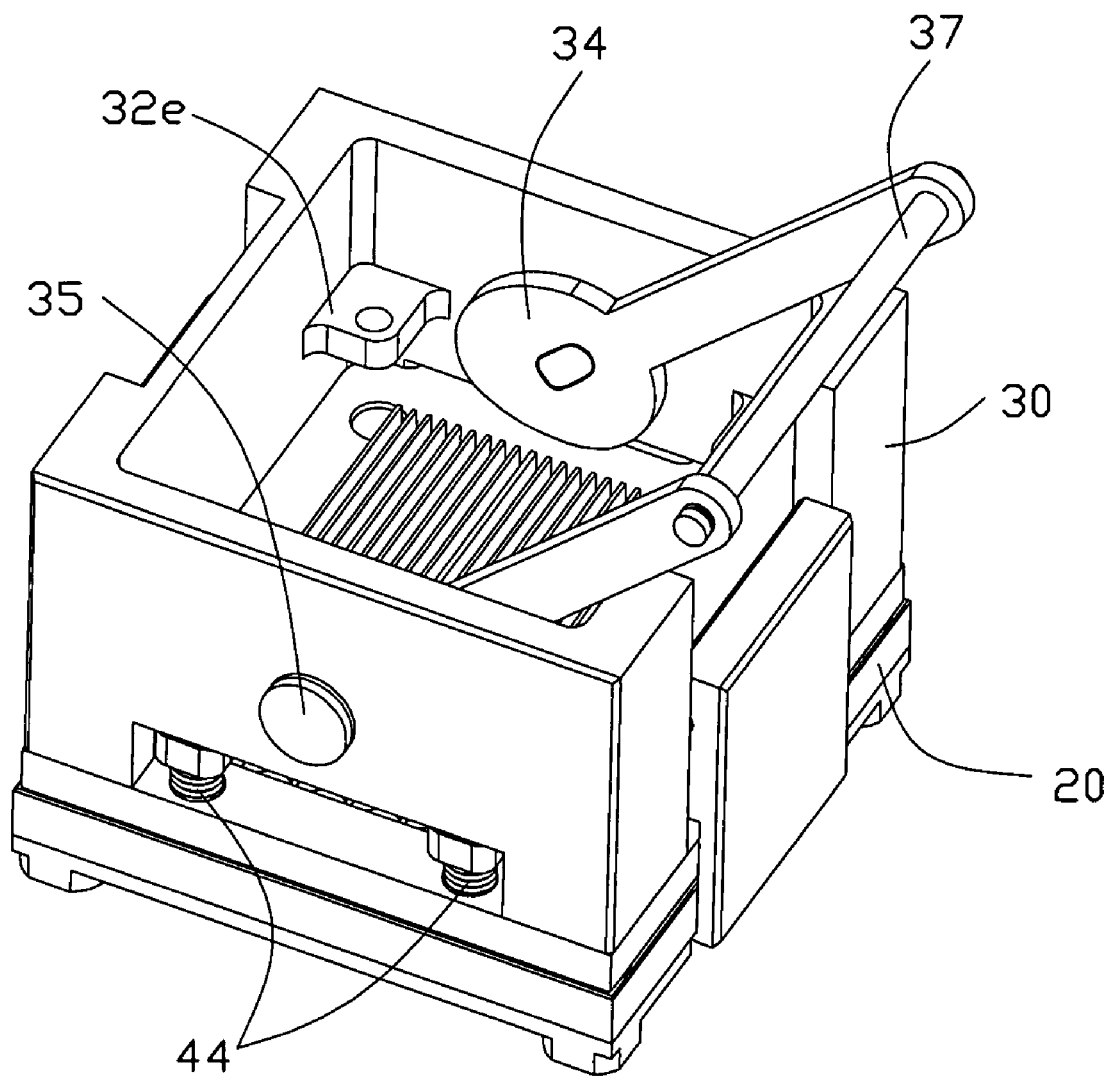
FIG. 2 is similar with FIG. 1, except that the fan is removed away.
Figure 3:
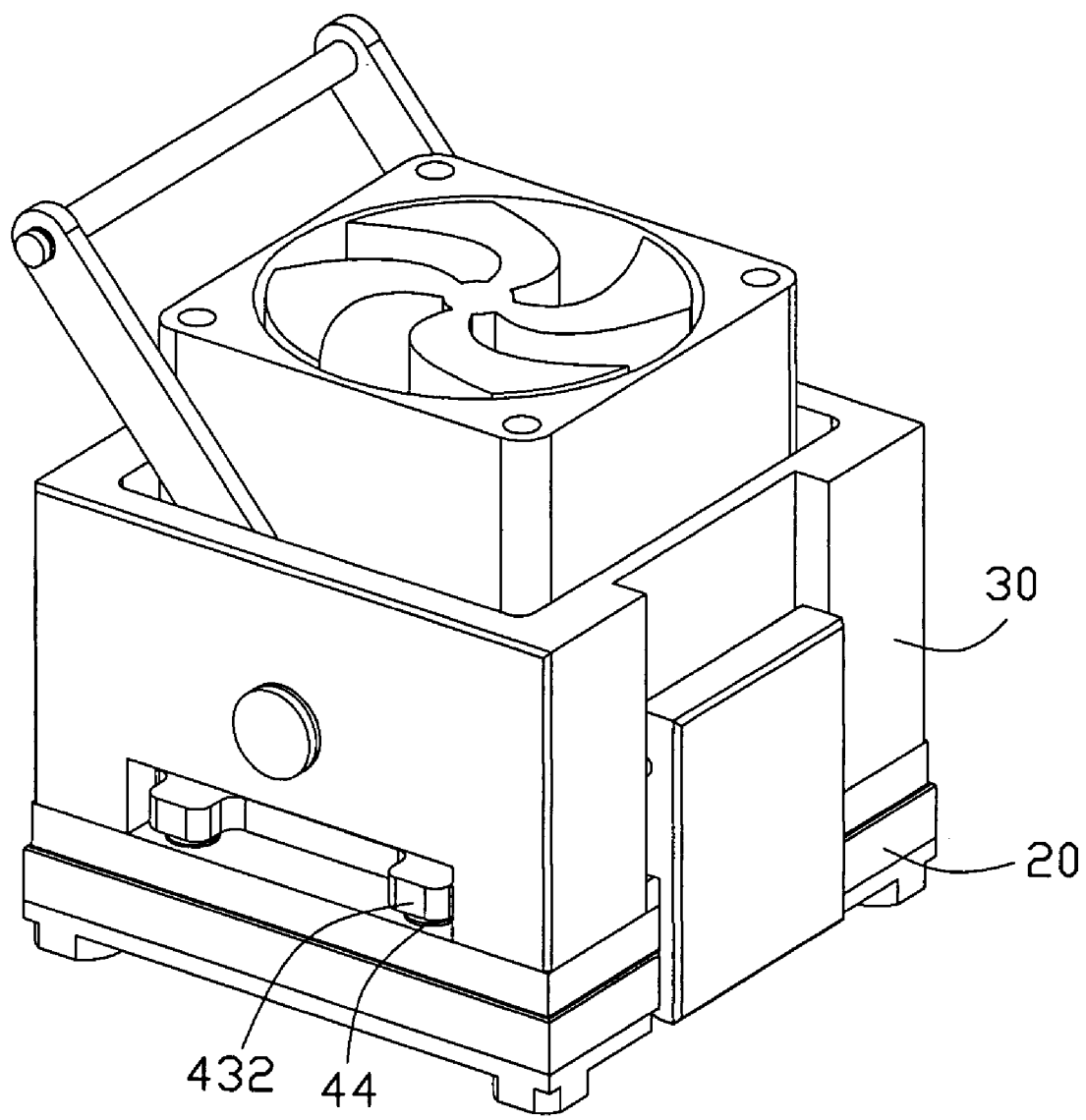
FIG. 3 is also similar with FIG. 1, but the actuator is in a close position.
Figure 4:
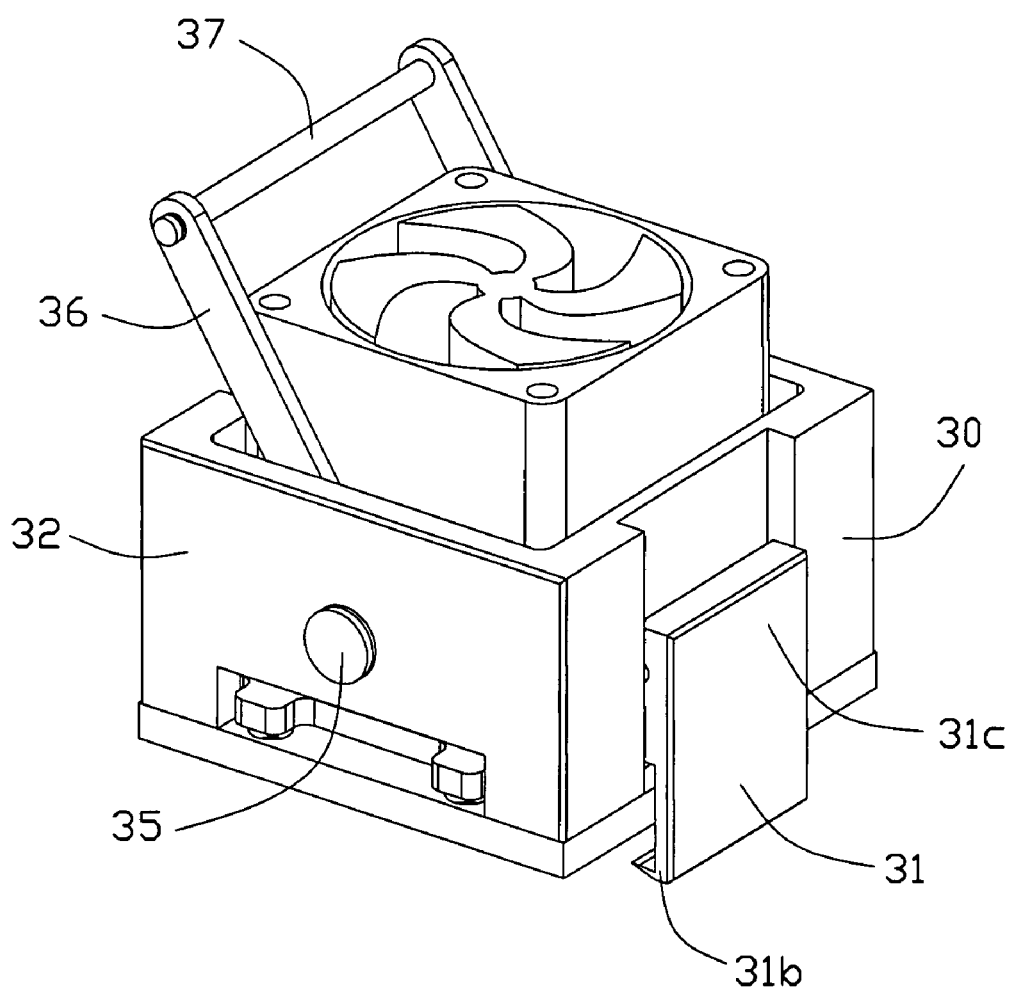
FIG. 4 is a partially assembly, perspective view of the socket connector assembly, the fan and the semiconductor package shown in FIG. 3.
Figure 4:
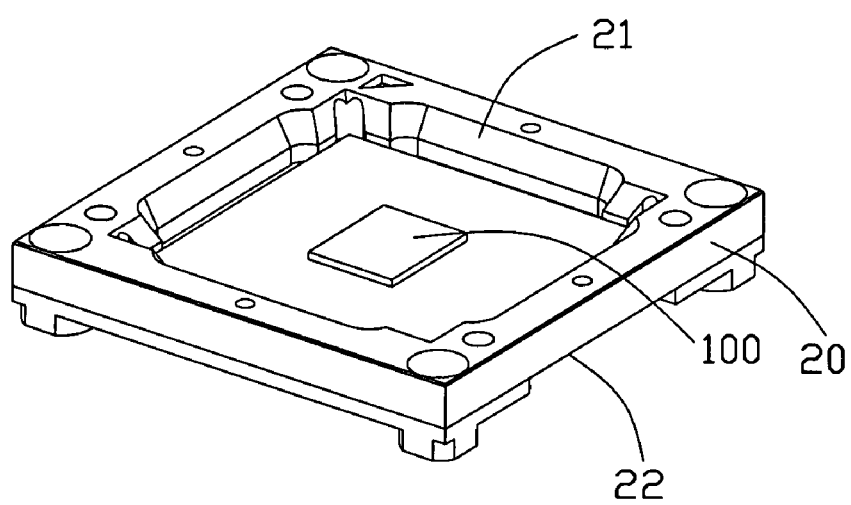

Referring again to FIG. 4, the semiconductor package 100 is placed in the socket connector 20. The heads 31c of the latches 31 of the actuator is pressed inwardly to rotate the legs 31b outwardly until the legs 31b latch with the engaging recesses 22 of the socket connector 20 and retain the actuator 30 to the socket connector 20. The socket connector assembly 10 is thereby assembled together. The fan is assembled on the actuator 30 and supported by the supporting boards 32e of the frame 32. Referring to FIGS. 1 and 2, primitively, the actuator 30 is in an opening position, the first springs 44 located between the base 40 and the cover 43 lift the floating module to a topmost position, the cam members 34 are respectively abuts against the front and back edges of the cover 43. In FIG. 3, the actuator 30 of the socket connector assembly 10 is in a close position, the floating module is in a lowermost position.

Figure 9:
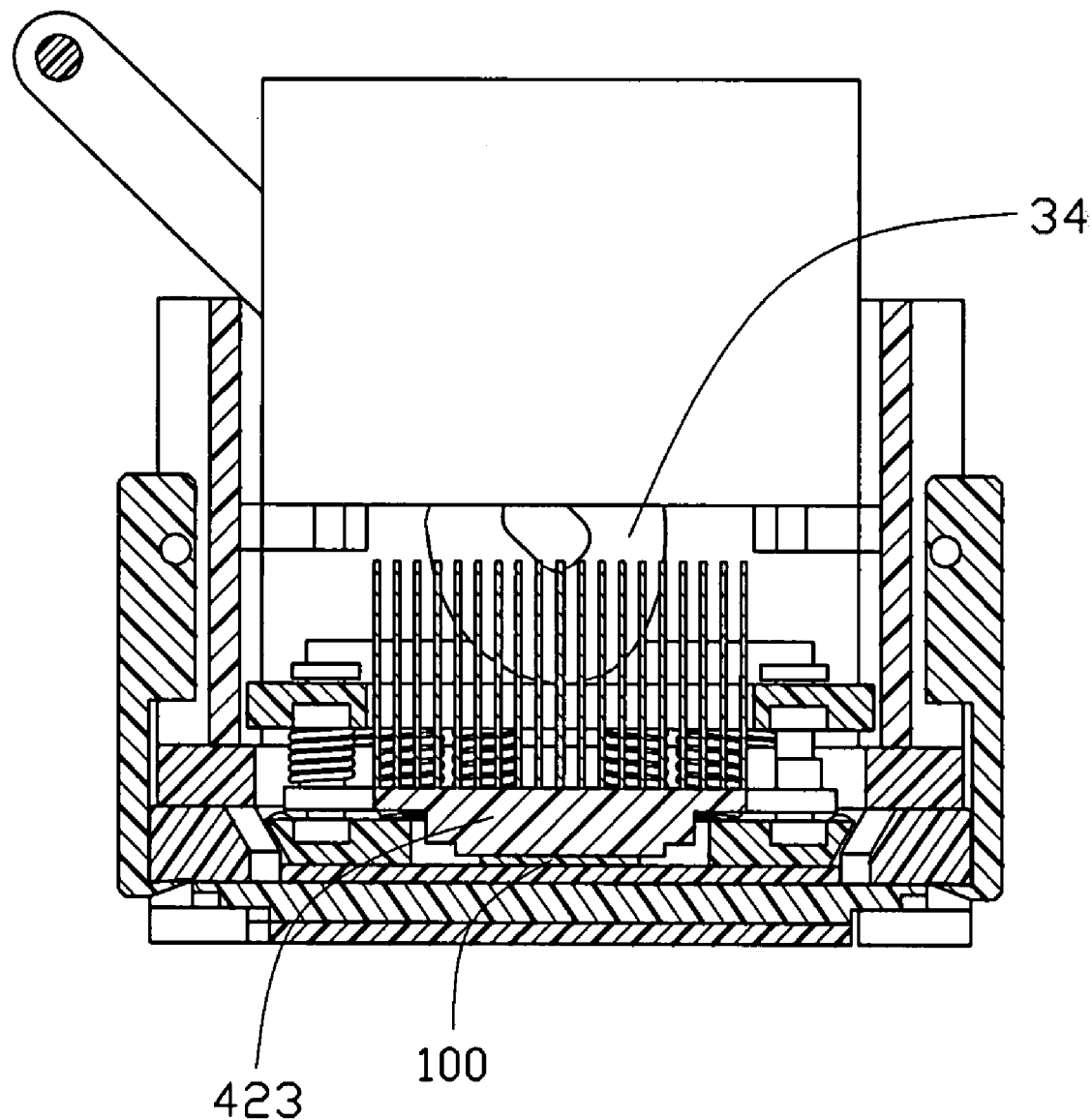
FIG. 9 is a section view of the socket connector assembly, wherein the fan and the semiconductor package is mounted in the socket connector assembly and the actuator is in the opening position.
Figure 10:
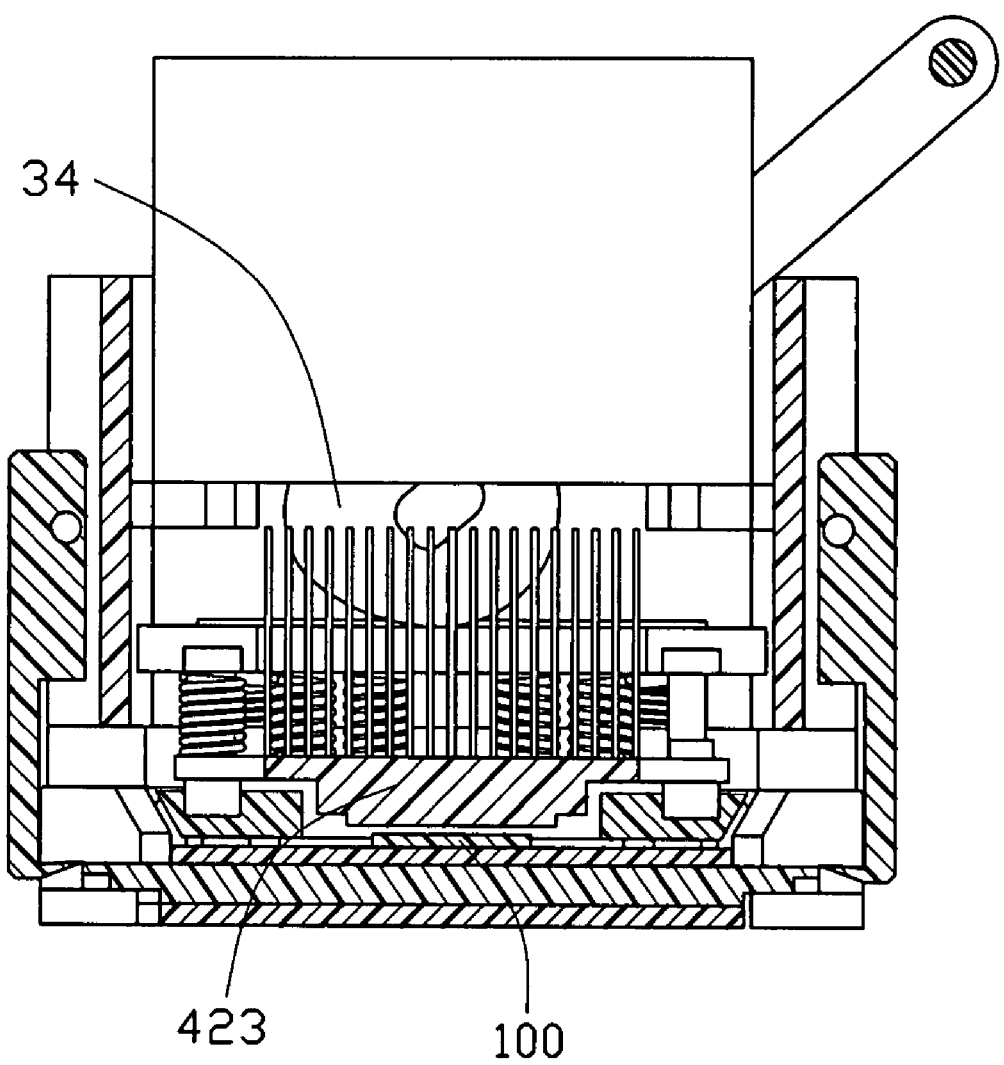
FIG. 10 is similar with FIG. 9, but the actuator is in the close position.

Referring to FIGS. 1-4, conjoined with FIGS. 9 and 10, in use, to move the actuator from the opening position to the close position, the cross handle 37 is urged to drive the cam members 34 to rotate round the blots 35. During this rotating process, a touching point between each cam portion 34 and the cover 43 moves away from a rotating axe of the cam member 34, it is means that the cam members 34 press the cover 34 and bring the floating module move downwardly relative to the base 40 and the socket connector 20. Simultaneously, the projecting portion 423 of the heat sink 42 moves down to touch a top surface of the semiconductor package 100, that facilitates dissipating heat generated from the semiconductor package 100 during testing, and the first springs 44 and the second springs 46 are compressed. When the actuator 30 is in the close position, a supporting force acting on the cam members 34 by the cover 43 which is caused by the compressed first springs 44 will drive the cam members 34 continue rotating, but the sidewall 32c will prevent the cam members 34 from further rotating, so the actuator 30 is steadily oriented at the close position. Thus the semiconductor package 100 is safely tested via the socket connector 20.

After testing, a disassembly process is needed to pick up the semiconductor package 100. The cross handle 37 is urged to drive the cam members 34 to rotate back. The first springs 44 upwardly lift the floating module. Then the heads 31c of the latches 31 are pressed inwardly to rotate the legs 31b outwardly until the legs 31b disengage with the socket connector 20. The actuator 30 is lifted up from the socket connector 20, together with the heat sink 42. The semiconductor package 100 is safely picked up from the socket connector 20.

Otherwise, the base and the frame may be integrated to one body, here called a housing. The housing has a front wall, a back wall, two opposed sidewalls linked the front wall and the back wall, and a bottom plate with an opening in the center. The cam portions and the blots are mounted to the front wall and the back wall; the latching arms are respectively attached to sidewalls; the floating module is received in the housing and supported by springs located on the bottom plate, the engaging portion of the floating module extends beyond a bottom face of the frame to contact with the semiconductor package received in the socket connector.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:
1. An actuator comprising:
a housing defining an opening thereof;
at least one cam portion rotatably retained to the housing; and
a floating module movably mounted to the housing and defining a topmost position and a lowermost position relative to the housing, the floating module being able to move between the topmost position and the lowermost position during a rotation of the cam portion in a vertical plane, and
a plurality of first springs located on the housing to support the floating module.
2. The actuator of claim 1, wherein the housing has a separated base defining the opening and a separated frame mounted upon the base, the first springs are located on the base to support the floating module received in the frame.

3. The actuator of claim 1, wherein the floating module has a heat sink with an engaging portion downwardly projecting beyond a bottom face of the housing.

4. The actuator of claim 3, wherein the actuator is used for being assembled to a socket connector for a semiconductor package, the engaging portion of the floating module contacts with the semiconductor package when the floating module is at the lowermost position.

5. The actuator of claim 3, wherein the floating module has a cover which is mounted upon the first springs, the cover is directly pressed by the cam portion to bring the floating module moving from the topmost position to the lowermost position and simultaneously to compress the first springs, so the floating module can move from the lowermost position to the topmost position by force of the first springs when the cam portion rotates back.

6. The actuator of claim 5, wherein the floating module has a casing with a hatch, the heat sinker is mounted on the casing with the engaging portion passing trough the hatch, the cover and the casing are retained together by blots with the heat sink sandwiched therebetween.

7. The actuator of claim 6, wherein the floating module further has a plurality of second springs, the heat sink has mounting ears, the second springs are located between the casing and the cover, and the mounting ears of the heat sink and the cover.

8. The actuator of claim 7, wherein the actuator has two said cam portions respectively retained to two inner opposed faces of the frame by blots, a pair of actuating levers respectively are integratedly connected to edges of the cam members, and a cross handle is disposed between two free ends of the pair of actuating levers.

9. An electrical connector assembly comprising:
a socket connector receiving a plurality of terminals and defining a receiving space; and
an actuator mounted to and located upon the socket connector, the actuator having at least one cam portion and a floating module which is directly pressed to move downwardly by an outline of the cam portion during a rotation of the cam portion, wherein
the receiving space of the socket connector is used for accommodating a semiconductor package, the floating module actuator defines a topmost position and a lowermost position relative to the socket connector, and the floating module contacts with the semiconductor package when the floating module arrives a lowermost position.

10. The electrical connector assembly of claim 9, wherein the actuator has a pair of latching arms for assembling the actuator to the socket connector.

11. The electrical connector assembly of claim 9, wherein the actuator has a housing to which the cam portion is retained, the floating module is moveably received in the housing by disposing a plurality of springs between the floating module and the housing.

12. The electrical connector assembly of claim 9, wherein the actuator has a separated base and a separated frame mounted upon the base, a plurality of springs are located on the base to support the floating module received in the frame, so that the floating module can move upwardly and downwardly relative to the frame.

13. The electrical connector assembly of claim 12, wherein the floating module has a casing with a hatch, a heat sinker mounted on the casing and a cover, the cover and the casing are retained together with the heat sink sandwiched therebetween, the cover is directly pressed by the cam portion to bring the floating module moving downwardly and simultaneously compress the springs.

14. The electrical connector assembly of claim 13, wherein the heat sink has an engaging portion beyond a bottom face of the floating module to contact with the semiconductor package.

15. An electrical connector assembly comprising:
an electrical connector receiving an electronic component therein and providing a plurality of terminals contacting the electronic component; and
a floating module located above the connector and downwardly pressed and actuated by actuator having a cam structure thereon, said floating module including an up-and-down floated heat sink and an up-and-down floated cover located above said heat sink; wherein
a first set of springs are engaged with an underside of the cover to urge the cover in an higher position so as to have the heat sink upwardly spaced from the electronic component with a gap therebetween, while also to allow the cover in a lower position so as to have the heat sink vertically intimately contact the electronic component for heat transfer; and
a second set of springs are arranged between and engaged with the cover and the heat sink to perform a buffer function when the heat sink vertically intimately contact the electronic component.

16. The electrical connector assembly as claimed in claim 15, wherein said actuator is mourned on a frame which is latched to the connector.

17. The electrical connector assembly as claimed in claim 15, further including a base directly positioned on a top of the connector, wherein the first set of springs is arranged between and engaged with the heat sink and the base.

18. The electrical connector assembly as claimed in claim 15, wherein due to the first set of springs, said cover and the associated heat sink are both up-and-down first floatable relative to the connector, while due to the second set of springs, said heat sink is up-and-down floatable relative to the cover, so that a displacement of the heat sink relative to the connector is smaller than that of the cover relative thereto.

* * * * *